United States Patent
Takasu

(10) Patent No.: US 7,446,330 B2
(45) Date of Patent: Nov. 4, 2008

(54) PHOSPHOR PANEL

(75) Inventor: Atsunori Takasu, Kaisei-machi (JP)

(73) Assignee: FUJIFILM Corporation, Tokyo (JP)

( * ) Notice: Subject to any disclaimer, the term of this patent is extended or adjusted under 35 U.S.C. 154(b) by 0 days.

(21) Appl. No.: 11/238,051

(22) Filed: Sep. 29, 2005

(65) Prior Publication Data

US 2006/0065862 A1    Mar. 30, 2006

(30) Foreign Application Priority Data

Sep. 29, 2004    (JP) .............................. 2004-285375

(51) Int. Cl.
  *A61B 6/00*     (2006.01)
  *G03C 5/16*     (2006.01)
  *H05B 3/00*     (2006.01)

(52) U.S. Cl. ...................... 250/580; 250/484.4; 250/581

(58) Field of Classification Search ................. 250/580, 250/581, 584, 484.4, 483.1, 486.1, 487.1, 250/488.1, 370.11
See application file for complete search history.

(56) References Cited

U.S. PATENT DOCUMENTS

| 4,939,018 | A | * | 7/1990 | Kohda et al. ................. 428/192 |
| 5,338,926 | A | * | 8/1994 | Yoshida ................. 250/214 VT |
| 6,221,516 | B1 | * | 4/2001 | Kohda et al. ................. 428/690 |
| 7,105,830 | B2 | * | 9/2006 | Nagano et al. ......... 250/370.11 |
| 2004/0108464 | A1 | * | 6/2004 | Fukui et al. ............... 250/484.4 |
| 2006/0065861 | A1 | * | 3/2006 | Tazaki ........................ 250/580 |
| 2006/0208208 | A1 | * | 9/2006 | Isoda et al. ................. 250/580 |

\* cited by examiner

*Primary Examiner*—David P. Porta
*Assistant Examiner*—Faye Boosalis
(74) *Attorney, Agent, or Firm*—Sughrue Mion, PLLC

(57) ABSTRACT

A phosphor panel is composed of a phosphor layer consisting essentially of phosphor in the form of columnar crystals and a protective layer provided on the phosphor layer via an adhesive layer, in which the adhesive layer has a thickness of 0.3 μm or more and intrudes into the phosphor layer in a depth of 2.0 μm or less.

7 Claims, 1 Drawing Sheet

PHOSPHOR PANEL

FIELD OF THE INVENTION

The present invention relates to a radiation image storage panel employable in a radiation image record and reproducing method utilizing an energy-storing phosphor.

BACKGROUND OF THE INVENTION

When an energy-storing phosphor (e.g., stimulable phosphor, which gives off stimulated emission) is exposed to radiation such as X-rays, it absorbs and stores a portion of the radiation energy. The phosphor then emits stimulated emission according to the level of the stored energy when exposed to electromagnetic wave such as visible or infrared light (i.e., stimulating light). A radiation image recording and reproducing method utilizing the energy-storing phosphor has been widely employed in practice. In that method, a radiation image storage panel, which is a sheet comprising the energy-storing phosphor, is used. The method comprises the steps of: exposing the storage panel to radiation having passed through an object or having radiated from an object, so that radiation image information of the object is temporarily recorded in the storage panel; sequentially scanning the panel with a stimulating light such as a laser beam to emit a stimulated light; and photoelectrically detecting the emitted light to obtain electric image signals. The storage panel thus treated is subjected to a step for erasing radiation energy remaining therein, and then kept for the use in the next recording and reproducing procedure. Thus, the radiation image storage panel can be repeatedly used.

The radiation image storage panel (often referred to as energy-storing phosphor sheet) has a basic structure comprising a support and an energy-storing phosphor layer provided thereon. However, if the phosphor layer is self-supporting, the support can be omitted. Further, a protective layer is generally provided on the free surface (surface not facing the support) of the phosphor layer to keep the phosphor layer from chemical deterioration or physical damage.

Various kinds of energy-storing phosphor layers are known. For example, the phosphor layer can comprise a binder and energy-storing phosphor particles dispersed therein, or otherwise can comprise agglomerate of an energy-storing phosphor without binder. The binder-less phosphor layer can be formed by a gas phase-accumulation method or by a firing method. For example, in the gas phase-accumulation method, the phosphor or material thereof is vaporized (or sputtered) and accumulated on a substrate to prepare a layer of the phosphor in the form of columnar crystals. The prepared phosphor layer consists of only the phosphor, and there are gaps among the columnar crystals of phosphor. Accordingly, the stimulating light can be applied efficiently enough and the emission can be collected also efficiently enough to improve the sensitivity. In addition, since the stimulating light is kept from scattering horizontally, an image of high sharpness can be obtained.

The radiation image recording and reproducing method (or radiation image forming method) has various advantages as described above. It is, however, still desired that the radiation image storage panel used in the method have as high sensitivity as possible and, at the same time, give a reproduced radiation image of as high quality (in regard to sharpness and graininess) as possible.

As a method for providing the protective layer, the wet coating method is known. It is also known to glue a protective film onto the phosphor layer with adhesive, namely, via an adhesive layer.

For example, UP-B-63-25320 discloses an adhesive layer satisfying the condition of:

$$d_{av.} \times \mu < \lambda/2 \text{ or } d_{av.} \times \mu > \lambda$$

in which $d_{av.}$ is the average thickness of the adhesive layer, $\mu$ is the refractive index of the adhesive layer, and $\lambda$ is the wavelength of the stimulating light. Disclosed herein is an adhesive layer formed on a phosphor layer comprising a binder and stimulable phosphor particles dispersed therein.

JP-A-2001-141896 discloses a radiation image storage panel comprising a stimulable phosphor layer and a protective film laminated thereon. The protective film has a thickness of 1 to 10 μm and is made of fluorocarbon resin. The phosphor layer described in the publication comprises a binder and a stimulable phosphor. In an example of the publication, an adhesive layer of 2 g/m$^2$ is formed by wet coating.

JP-A-2004-37448 describes a stimulable phosphor screen having a phosphor layer formed by vapor-deposition. The phosphor layer comprises phosphor in the form of needle-like crystals, and gaps among the crystals are partly filled with a polymer compound to improve the mechanical strength of the phosphor layer. According to the publication, known binder polymers can be used as the polymer compound. The publication also describes that a coating solution for forming a protective layer can be spread on the phosphor layer, so as to form the protective layer and, at the same time, to fill the gaps in. It is further described that the gaps are filled with the polymer compound in a depth of at least 5 μm.

The applicant has already proposed a radiation image storage panel comprising a stimulable phosphor layer, an adhesive layer and a transparent moisture-proof film (U.S. Ser. No. 11/008,225). The transparent moisture-proof film comprises a transparent thin film having a thickness of 1 to 10 μm and a moisture-proof layer formed thereon, and is glued on the phosphor layer via the adhesive layer having a thickness of 0.1 to 10 μm (preferably 0.1 to 3 μm). As a result of further study, the applicant has found that this storage panel often gives a blurry radiation image if the phosphor layer has a structure without binder (namely, binder-less structure), particularly, if the phosphor layer consists of phosphor in the form of columnar crystals (among which there are gaps). The applicant's study has further revealed that, when the adhesive layer is formed on the phosphor layer to glue the protective layer or the like, material of the adhesive layer partly intrudes into the gaps to make the radiation image blurry. Even if the adhesive layer intrudes in a depth of no more than several micrometers, the resultant radiation image is remarkably impaired in sharpness.

SUMMARY OF THE INVENTION

It is an object of the present invention to provide a radiation image storage panel giving a radiation image of high sharpness and having sufficient adhesion strength between the protective layer and the phosphor layer.

The applicant has studied the above problem, and found that the sharpness is not much impaired when the adhesive layer intrudes in a depth of 2.0 μm or less and also found that the adhesive layer of 0.3 μm or more thickness ensures practically satisfactory adhesion strength between the protective layer and the phosphor layer.

The present invention resides in a radiation image storage panel which comprises a phosphor layer consisting of phosphor in the form of columnar crystals and a protective layer provided thereon via an adhesive layer, wherein the adhesive layer has a thickness of 0.3 μm or more and intrudes into the phosphor layer in a depth of 2.0 μm or less.

The radiation image storage panel of the invention comprises the protective layer glued onto the phosphor layer with practically satisfactory adhesion strength, and can give a radiation image of satisfactory sharpness. The radiation image storage panel of the invention, therefore, can be advantageously used for a long period of time, for example, in medical diagnoses on radiation images.

DETAILED DESCRIPTION OF THE INVENTION

In the radiation image storage panel of the invention, the adhesive layer preferably has a thickness in the range of 0.3 to 3.0 μm.

The protective layer preferably has a thickness in the range of 1 to 10 μm. In addition, the protective layer preferably is a resin film.

On at least one surface of the protective layer, a moisture-proof layer made of inorganic substance and having a moisture permeability of 1 g/m²·day or less is preferably provided.

Further, on at least one surface of the protective layer or of the moisture-proof layer, a stimulating light-antireflection layer is preferably provided. It is particularly preferred for the moisture-proof layer to serve also as the stimulating light-antireflection layer.

The radiation image storage panel of the invention preferably comprises a support, a phosphor layer, an adhesive layer, a moisture-proof layer and a protective layer, overlaid in order.

In the following description, the radiation image storage panel of the invention is explained in detail with the attached drawings referred to.

Figure 1:
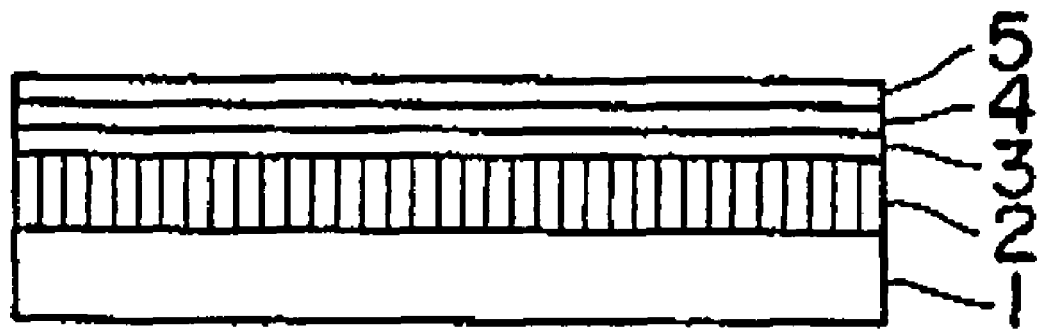
FIG. 1 is a sectional view schematically illustrating an example of the constitution of radiation image storage panel according to the invention.
Figure 2:
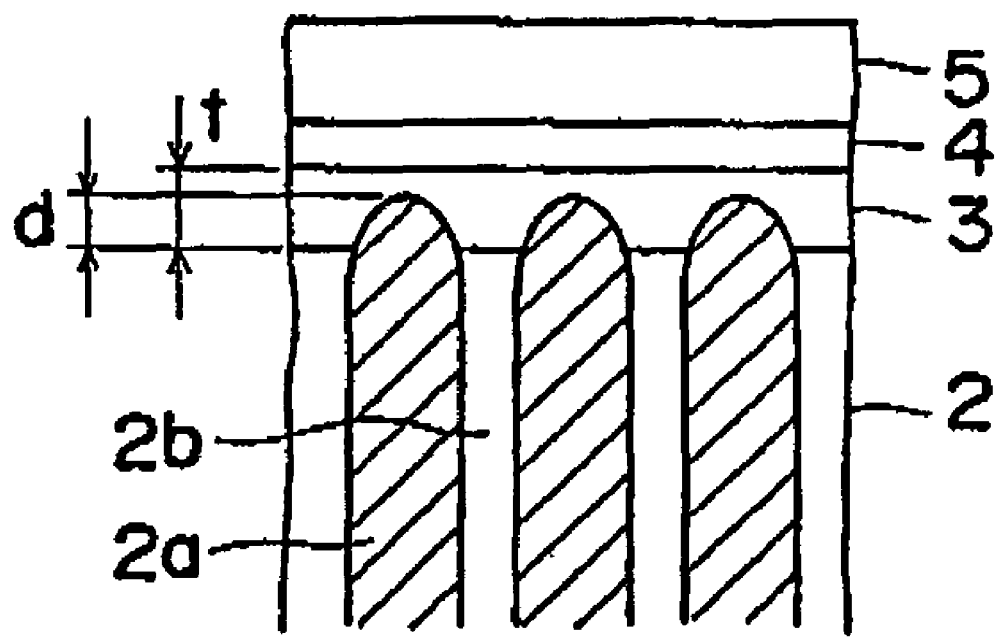
FIG. 2 is an enlarged partial view of FIG. 1.

FIG. 1 is a sectional view schematically illustrating an example of the constitution of radiation image storage panel according to the invention, and FIG. 2 is an enlarged partial view of FIG. 1. In FIGS. 1 and 2, the storage panel comprises a support 1, an energy-storing phosphor layer 2, an adhesive layer 3, a moisture-proof layer 4, and a protective layer 5.

The energy-storing phosphor layer 2 comprises energy-storing phosphor in the form of columnar crystals and contains essentially no binder. In fact, the phosphor layer 2 comprises columnar crystals 2a of the phosphor and gaps 2b among them (see, FIG. 2). A columnar crystal-structured phosphor layer can be generally formed by a gas phase-accumulation method, as described later.

The adhesive layer 3 is made of a resin material (adhesive). Example of the resin materials include polyester resins, polyurethane resins, polyacetic resins, polyacrylic resins, soft acrylic resins, polyvinyl resins, polyamide resins, epoxy resins, and elastic resins. These can be used singly or in combination.

For the sake of adhesion strength between the moisture-proof layer 4 (the protective layer 5) and the phosphor layer 2, the adhesive layer 3 has a thickness (t) of 0.3 μm or more. The thickness (t) more preferably is in the range of 0.3 to 3.0 μm in consideration of both the adhesion strength and the sharpness of the reproduced image. Further, in view of the sharpness, the adhesive layer 3 intrudes into the gaps 2b among the columnar crystals 2a of the phosphor layer 2 in a depth (d: intruding depth) of 2.0 μm or less.

The protective layer 5 generally is a transparent film, preferably a transparent resin film. In consideration of the sharpness, the thickness of the protective layer is preferably in the range of 1 to 10 μm, more preferably in the range of 2 to 7 μm.

The moisture-proof layer 4 provided on one surface of the protective layer 5 (i.e., provided between the adhesive layer 3 and the protective layer 5 in FIG. 1) is expected to keep the phosphor layer 2 from deterioration caused by hygroscopic moisture, and is generally made of inorganic material. The moisture permeability of the moisture-proof layer is generally 1 g/m²·day or less, preferably 0.2 g/m²·day or less. Further, the moisture-proof layer absorbs light in the wavelength region of 300 to 1,000 nm preferably in an amount of 5% or less. Furthermore, as described later, the moisture-proof layer preferably serves also as a stimulating light-antireflection layer.

In the invention, the adhesive layer 3 is made to have the above-mentioned thickness and to intrude into the phosphor layer 2 in the above-mentioned intruding depth, and thereby the storage panel of the invention can have practically satisfactory adhesion strength between the protective layer and the phosphor layer and, at the same time, can give a radiation image of excellent sharpness. Accordingly, the storage panel of the invention keeps excellent durability and can give images of high quality for a long period of time.

The radiation image storage panel of the invention is by no means restricted to the that illustrated in the drawings, and can have various other auxiliary layers and/or can be subjected to various treatments as described later.

In the following description, the process for preparation of the radiation image storage panel of the invention is explained in detail, by way of example, in the case where the phosphor is an energy-storing phosphor and where the phosphor layer is formed by the vapor-deposition process performed with a resistance heater.

The substrate on which the deposited phosphor layer is to be formed is normally used as a support of the storage panel, and hence can be optionally selected from known materials conventionally used as a support of storage panel. The substrate is preferably a sheet of quartz glass, sapphire glass; metal such as aluminum, iron, tin or chromium; or resin such as aramide. Particlarly preferred is an aluminum plate. For improving the sensitivity or the image quality (e.g., sharpness and graininess), auxiliary layers such as a light-reflecting layer (which contains a light-reflecting material such as titanium dioxide) and a light-absorbing layer (which contains a light-absorbing material such as carbon black) can be provided. Further, in order to promote growth of the columnar crystals, a great number of very small convexes or concaves may be provided on the substrate surface (or on the above auxiliary layer if provided) on which the vapor is to be deposited.

The energy-storing phosphor preferably is a stimulable phosphor giving off stimulated emission in the wavelength region of 300 to 500 nm when exposed to a stimulating light in the wavelength region of 400 to 900 nm.

Particularly preferred is an alkali metal halide stimulable phosphor represented by the following formula (I):

$$M^I X \cdot aM^{II} X'_2 \cdot bM^{III} X''_3 : zA \qquad (I)$$

in which $M^I$ is at least one alkali metal selected from the group consisting of Li, Na, K, Rb and Cs; $M^{II}$ is at least one alkaline earth metal or divalent metal selected from the group consisting of Be, Mg, Ca, Sr, Ba, Ni, Cu, Zn and Cd; $M^{III}$ is at least one rare earth element or trivalent metal selected from the group consisting of Sc, Y, La, Ce, Pr, Nd, Pm, Sm, Eu, Gd, Tb, Dy, Ho, Er, Tm, Yb, Lu, Al, Ga and In; A is at least one rare earth element or metal selected from the group consisting of Y, Ce, Pr, Nd, Sm, Eu, Gd, Tb, Dy, Ho, Er, Tm, Yb, Lu, Mg, Cu and Bi; each of X, X' and X" is independently at least one halogen selected from the group consisting of F, Cl, Br and I; and a, b and z are numbers satisfying the conditions of $0 \leq a < 0.5$, $0 \leq b < 0.5$ and $0 < z < 1.0$, respectively.

It is also preferred to use a rare earth activated alkaline earth metal fluoride halide stimulable phosphor represented by the following formula (II):

$$M^{II}FX:zLn \qquad (II)$$

in which $M^{II}$ is at least one alkaline earth metal selected from the group consisting of Ba, Sr and Ca; Ln is at least one rare earth element selected from the group consisting of Ce, Pr, Sm, Eu, Tb, Dy, Ho, Nd, Er, Tm and Yb; X is at least one halogen selected from the group consisting of Cl, Br and I; and z is a number satisfying the condition of $0 < z \leq 0.2$.

Still also preferred is a rare earth activated alkaline earth metal sulfide stimulable phosphor represented by the following formula (III):

$$M^{II}S:A,Sm \qquad (III)$$

in which $M^{II}$ is at least one alkaline earth metal selected from the group consisting of Mg, Ca and Sr; and A is preferably Eu and/or Ce.

Further, yet another preferred phosphor is a cerium activated trivalent metal oxide halide stimulable phosphor represented by the following formula (IV):

$$M^{III}OX:Ce \qquad (IV)$$

in which $M^{III}$ is at least one rare earth element or trivalent metal selected from the group consisting of Pr, Nd, Pm, Sm, Eu, Tb, Dy, Ho, Er, Tm, Yb and Bi; and X is at least one halogen selected from the group consisting of Cl, Er and I.

The phosphor used in the invention is not restricted to the energy-storing phosphor. It may be a phosphor absorbing radiation such as X-rays and instantly giving off (instant) emission in the ultraviolet or visible resin. Examples of that phosphor include phosphors of $LnTaO_4$: (Nb, Gd) type, $Ln_2SiO_5$:Ce type and LnOX:Tm type (Ln is a rare earth element); CsX (X is a halogen) type; $Gd_2O_2S$:Tb; $Gd_2O_2S$:Pr,Ce; $ZnWO_4$; $LuAlO_3$:Ce; $Gd_3Ga_5O_{12}$:Cr,Ce; and $HfO_2$.

In the case where the vapor-deposited phosphor layer is formed by multi-vapor deposition (co-deposition), at least two evaporation sources are used. One of the sources contains a matrix material of the energy-storing phosphor, and the other contains an activator material. The multi-vapor deposition is preferred because the vaporization rate of each source can be independently controlled to incorporate the activator homogeneously in the matrix even if the materials have very different melting points or vapor pressures. According to the composition of the desired phosphor, each evaporation source may consist of the matrix material or the activator material only or otherwise may be a mixture with additives. Three or more sources may be used. For example, in addition to the above sources, another evaporation source containing additives may be used.

The matrix material of the phosphor may be either the matrix compound itself or a mixture of two or more substances that react with each other to produce the matrix compound. The activator material generally is a compound containing an activator element, and hence is, for example, a halide or oxide of the activator element.

If the activator is Eu, the Eu-containing compound of the activator material preferably contains $Eu^{2+}$ as much as possible because the aimed stimulated emission (even if, instant emission) is emitted from the phosphor activated by $Eu^{2+}$. Since commercially available Eu-containing compounds generally contain oxygen molecules, they generally contain both $Eu^{2+}$ and $Eu^{3+}$. The Eu-containing compounds, therefore, are preferably melted under Br gas-atmosphere so that oxygen-free $EuBr_2$ can be prepared to use.

The evaporation source preferably contains water in a content of 0.5 wt. % or less. For preventing the source from bumping, it is particularly important to control the water content in the above-mentioned low range if the material of matrix or activator is a hygroscopic substance such as EuBr or CsBr. The materials are preferably dried by heating at 100 to 300° C. under reduced pressure. Otherwise, the materials may be heated under dry atmosphere such as nitrogen gas atmosphere to melt at a temperature above the melting point for several minutes to several hours.

The evaporation source, particularly the source containing the matrix material, contains impurities of alkali metal (alkali metals other than ones constituting the phosphor) preferably in a content of 10 ppm or less and impurities of alkaline earth metal (alkaline earth metals other than ones constituting the phosphor) preferably in a content of 5 ppm or less (by weight). That is particularly preferred if the phosphor is an alkali metal halide stimulable phosphor represented by the formula (I). Such preferred evaporation source can be prepared from materials containing the impurities little.

The two or more evaporation sources and the substrate are placed in a vacuum evaporation-deposition apparatus. The apparatus is then evacuated to give a medium vacuum of 0.1 to 10 Pa, preferably 0.1 to 4 Pa. In addition, it is particularly preferred that, after the apparatus is evacuated to a high vacuum of $1 \times 10^{-5}$ to $1 \times 10^{-2}$ Pa, an inert gas such as Ar, Ne or $N_2$ gas be introduced into the apparatus so that the inner pressure may be the above-mentioned medium vacuum. Thus, partial pressures of water and oxygen can be reduced. The apparatus can be evacuated by means of an optional combination of, for example, a rotary pump, a turbo molecular pump, a cryo pump, a diffusion pump and a mechanical buster.

The evaporation sources are then vaporized utilizing resistance heaters (resistance heating process). The resistance heating process is advantageous because the evaporation-deposition procedure can be carried out in a medium vacuum and also because a phosphor layer consisting of good columnar crystals can be easily formed. For heating the evaporation sources, electric currents are supplied to resistance heaters. The sources of matrix and activator materials are thus heated, vaporized, reacted with each other to form the phosphor, which is deposited and accumulated on the substrate. The distance between the substrate and each source depends on various conditions such as the size of substrate, but is generally in the range of 10 to 1,000 mm. The distance between the sources is generally in the range of 10 to 1,000 mm. During this procedure, the substrate may be heated or cooled. The temperature of the substrate is generally in the range of 20 to 350° C., preferably in the range of 100 to 300° C. The deposition rate can be controlled by adjusting the electric currents supplied to the heaters. The deposition rate is generally in the range of 0.1 to 1,000 μm/min., preferably in the range of 1 to 100 μm/min.

Before preparing the above deposited phosphor layer, another deposited layer consisting of the phosphor matrix alone may be beforehand formed. The layer of the phosphor matrix alone makes the thereon-formed phosphor crystallize well in the form of columnar shape. In the thus-formed layers, the additives such as the activator contained in the phosphor-deposited layer are often diffused into the matrix alone-deposited layer while they are heated during the deposition and/or during the heating treatment performed after the deposition, and consequently the interface between the layers is not always clear. The vapor-deposition procedure with resistance heaters can be repeated twice or more to form a phosphor layer consisting of two or more sub-layers. After the deposition procedure is complete, the formed layer can be subjected to heating treatment (i.e., annealing treatment).

In the case where the phosphor layer is produced by mono-vapor deposition, only one evaporation source containing the stimulable phosphor itself or a mixture of materials thereof is heated with a single resistance-heating unit. The evaporation source is beforehand prepared so that it may contain the activator in a desired amount. Otherwise, in consideration of vapor pressure difference between the matrix components and the activator, the deposition procedure can be carried out while the matrix components are being supplied to the evaporation source.

The produced phosphor layer consists of stimulable phosphor in the form of columnar crystals grown almost in the thickness direction. The phosphor layer contains no binder and consists of the stimulable phosphor only, and there are gaps among the columnar crystals. The thickness of the phosphor layer depends on, for example, the desired characteristics of the storage panel, conditions and process of the deposition, but is generally in the range of 50 µm to 1 mm, preferably in the range of 200 to 700 µm.

The gas phase-accumulation method usable in the invention is not restricted to the above-described vapor-deposition process performed utilizing a resistance heater, and various other known processes such a vapor-deposition process with an electron beam, a sputtering process and a CVD process can be used.

Onto the phosphor layer, a protective layer is fixed via an adhesive layer so as to ensure good handling of the storage panel in transportation and to avoid deterioration. The protective layer is preferably transparent so as not to prevent the stimulating light from coming in or not to prevent the emission from coming out. Further, for protecting the panel from chemical-deterioration and physical damage, the protective layer is preferably chemically stable, physically strong, and of high moisture proof.

The protective layer can be a film of organic polymer (resin) such as polyethylene terephthalate, polyethylene naphthalate, polyamide, polyimide, aramide resin, polycarbonate, polyethylene, polyurethane, polypropylene, polyvinylidene chloride, cyclic olefin or norbornene plastics or amorphous polyester plastics having fluorene skeleton; or a transparent glass plate. The protective layer is preferably a film of organic polymer such as polyethylene terephthalate because other layers can be easily provided thereon and also because it can be easily glued on the phosphor layer. Various additives can be dispersed in the polymer film. Examples of the additives include light-scattering fine particles (e.g., particles of magnesium oxide, zinc oxide, titanium dioxide and alumina), a slipping agent (e.g., powders of perfluoro-olefin resin and silicone resin) and a crosslinking agent (e.g., polyisocyanate). The thickness of the protective layer is generally in the range of about 1 to 10 µm (preferably, about 2 to 7 µm) if the layer is a polymer film or in the range of about 100 to 1,000 µm if the layer is a glass plate.

On at least one surface of the protective layer, a moisture-proof layer is preferably provided to prevent the phosphor layer from deterioration caused by hygroscopic moisture. It is particularly preferred to provide the moisture-proof layer on the adhesive layer-side surface of the protective layer (see, FIG. 1). If the moisture-proof layer is positioned between the adhesive layer and the protective layer, the moisture-proof layer is hardly damaged and hence can keep high moisture resistance. The moisture-proof layer has a moisture permeability of generally 1 $g/m^2$·day or less, preferably 0.2 $g/m^2$·day or less. The moisture-proof layer is preferably made of transparent inorganic material having gas-barrier properties and a light-absorption of 5% or less in the wavelength range of 300 to 1,000 nm. The inorganic material is, for example, metal oxide, metal nitride or metal oxynitride. Examples of the inorganic materials include silicon oxide, silicon nitride, aluminum oxide, aluminum nitride, zirconium oxide, tin oxide, silicon oxynitride, and aluminum oxynitride. Preferred are aluminum oxide, silicon oxide and silicon oxynitride because they have high a light transmittance and excellent gas-barrier property and also because they can be formed in the form of a thin layer having few cracks or micropores. The moisture-proof layer can consist of a single layer or plural sub-layers. In the case where the layer consists of two or more sub-layers, the sub-layers may be made of either different materials or the same material.

The moisture-proof layer can be formed on the protective layer according to the vacuum-accumulation method (by which a thin layer can be formed under vacuum) or according to the wet coating method such as a sol-gel process. Examples of the vacuum-accumulation methods include dry processes such as a vapor-deposition process, a sputtering process, a PVD (physical vapor deposition) process, and a CVD process. It is particularly preferred that vacuum-accumulation and wet-coating be alternately performed in combination to form a moisture-proof layer consisting of two or more sub-layers. In the formed moisture-proof layer, a sub-layer formed by wet-coating fills in cracks of the sub-layer formed thereunder by vacuum-accumulation. Further, since a sub-layer of wet-coating has a smooth surface (on which there is no fine convex or concave), another sub-layer can be densely formed thereon by vacuum-accumulation. Accordingly, the moisture-proof layer consisting of those sub-layers shows further improved moisture resistance. Examples of binders used in the wet-coating process include polyvinyl alcohol resins and acrylic resins. The sub-layer of wet-coating can be simply made of resin alone, and various known resins can be used.

On one surface of the protective layer (or on one surface of the moisture-proof layer), a stimulating light-antireflection layer is preferably provided so as to prevent the stimulating light from interfering to give an uneven image. It is necessary for the antireflection layer to make the surface reflectance generally 5% or less, preferably 3% or less to the stimulating light at an incident angle of 0 to 60°. The antireflection layer has a haze value generally in the range of 3 to 30%, preferably 5 to 20%. The thickness of the antireflection layer is generally in the range of 50 to 400 nm, preferably in the range of 50 to 200 nm.

The antireflection layer can be formed from inorganic material (such as inorganic oxides, oxynitrides, nitrides and fluorides) by the vapor-deposition process or by the sputtering process. The antireflection layer can consist of either only one layer or plural sub-layers. If the antireflection layer consists of a single layer, it preferably is a low refractive layer. On the other hand, for preparing the antireflection layer consisting of two or more sub-layers, it is preferred that low-refractive sub-layers and high-refractive ones be alternately formed. Examples of materials for the low refractive (sub-) layer include magnesium fluoride and silicon oxide. Examples of materials for the high refractive sub-layer include titanium oxide, zirconium oxide, tin oxide, indium oxide, and aluminum oxide. The moisture-proof layer can also serve as the stimulating light-antireflection layer.

Otherwise, the stimulating light-antireflection layer may comprise resin and organic and/or inorganic fine particles dispersed therein. Further, there may be fine voids dispersed in the resin. The organic fine particles generally has a mean size of 1 μm or less. Examples of materials for the organic fine particles include polymethyl methacrylate (PMMA), melamine resin, silicone resin and Teflon [Trade name] resin. The inorganic fine particles generally has a mean size of 0.5 to 200 nm. Examples of materials for the inorganic fine particles include metal oxides, metal nitrides, metal sulfides, and metal halides.

The protective layer, (provided with the moisture-proof layer and/or the stimulating light-antireflection layer) can be glued onto the phosphor layer via the adhesive layer, for example, in the following manner. First, a releasable film comprising a base film and an adherent layer provided thereon is prepared. The base film generally has a thickness of 10 to 500 μm, and is made of resin such as olefin plastics, vinyl plastics or polyester plastics. The adherent layer is made of acrylic or silicone adhesive agent.

On the adherent layer of the releasable film, an organic polymer film (to be the protective layer) is glued. The moisture-proof layer and/or the stimulating light-antireflection layer can be formed thereon. In the case where these layers are to be provided on the opposite surface or both surfaces of the protective layer, first they are formed on the polymer film (i.e., protective layer), second another releasable film is glued thereon, third the first releasable film (which covers the polymer film on the side opposite to the moisture-proof layer and/or the antireflection layer) is removed, and then the polymer film (provided with the moisture-proof layer and/or the antireflection layer) is turned upside down. On the surface of the protective layer (or on the surface of the moisture-proof layer or the stimulating light-antireflection layer), a coating solution containing resin is spread and dried to prepare the adhesive layer. The adhesive layer is formed so that the thickness can become 0.3 μm or more, preferably in the range of 0.3 to 3.0 μm.

Examples of the resins for forming the adhesive layer are the same as described above. Examples of solvents for the coating solution include lower alcohols such as methanol, ethanol, n-propanol and n-butanol; chlorinated hydrocarbons such as methylene chloride and ethylene chloride; ketones such as acetone, methyl ethyl ketone and methyl isobutyl ketone; esters of lower aliphatic alcohols with lower aliphatic acids such as methyl acetate, ethyl acetate and butyl acetate; ethers such as dioxane, ethylene glycol monoethyl ether, ethylene glycol monomethyl ether and tetrahydrofuran; and mixtures thereof. The coating procedure can be carried out by a known means such as a doctor blade, a roll coater or a knife coater.

The releasable film (on which the layers such as the protective layer and the adhesive layer are provided) is placed on the phosphor layer beforehand formed on the substrate so that the adhesive layer can be brought into contact with the phosphor layer. Then, the film and the phosphor layer are glued by hot-press in the manner that the adhesive layer intrudes into the phosphor layer in a depth of 2.0 μm or less, and then the releasable film is peeled off. In this way, the protective layer and other layers are provided on the phosphor layer via the adhesive layer. The releasable film can be removed before the layers are placed on the phosphor layer. The releasable film prevents the protective layer from wrinkling when the moisture-proof layer and other layers are provided thereon, and as a result the layers can be formed evenly.

If the protective layer is a glass plate or the like, it is also possible to glue the plate (to be the protective layer) directly on the phosphor layer without the releasable film. In that case, the plate is beforehand coated with the adhesive layer.

Thus, the radiation image storage panel of the invention can be produced. The storage panel of the invention can be in known various structures. For example, in order to improve the sharpness of the resultant image, at least one of the layers can be colored with a colorant which absorbs the stimulating light and/or the stimulated emission. In that case, the adhesive layer is preferably colored because it can be easily colored without impairing other characteristics.

EXAMPLE 1

(1) Evaporation Source

As the evaporation sources, powdery cesium bromide (CsBr, purity: 4N or more) and europium bromide (EuBr$_2$, purity: 3N or more) melt were prepared. In order to obtain the EuBr$_2$ melt, powdery europium bromide was placed in a platinum crucible and heated to melt at 800° C. in a tube furnace under enough halogen gas atmosphere to prevent oxidization. Each evaporation source was analyzed according to ICP-MS method (Inductively Coupled Plasma Mass Spectrometry), to find impurities. As a result, the CsBr powder was found to contain each of the alkali metals (Li, Na, K, Rb) other than Cs in an amount of 10 ppm or less and other elements such as alkaline earth metals (Mg, Ca, Sr, Ba) in amounts of 2 ppm or less. The EuBr$_2$ melt was also found to contain each of the rare earth elements other than Eu in an amount of 20 ppm or less and other elements in amounts of 10 ppm or less. The evaporation sources are very hygroscopic, and hence were stored in a desiccator keeping a dry condition whose dew point was −20° C. or below. Immediately before used, they were taken out of the desiccator.

(2) Preparation of Phosphor Layer

A glass substrate (thickness: 8 mm) as a support was washed successively with an aqueous alkaline solution, purified water and IPA (isopropyl alcohol). The thus-treated substrate was mounted to a substrate holder in an evaporation-deposition apparatus. The CsBr and EuBr$_2$ evaporation sources were individually placed in crucibles equipped with resistance heaters, respectively, so that the distance between the substrate and each evaporation source was 15 cm. The apparatus was then evacuated to make the inner pressure 1×10⁻⁵ Pa by means a combination of a rotary pump, a mechanical booster and a turbo molecular pump, and successively Ar gas (purity; 5N) was introduced to set the inner pressure at 1.0 Pa (Ar gas pressure). The substrate was then heated to 100° C. by means of a sheath heater placed on the back side (the opposite side to the face which the vapor is to be deposited on). The evaporation source were heated and melted by means of the resistance heaters, so that CsBr:Eu phosphor was accumulated on the substrate at a rate of 10 μm/minute. After the evaporation-deposition was complete, the inner pressure was returned to atmospheric pressure and then the substrate was taken out of the apparatus. On the substrate, a phosphor layer (thickness: 600 μm) was formed. The phosphor layer consisted of the stimulable phosphor in the form of columnar crystals grown almost perpendicularly and aligned densely.

(3) Preparation of Protective Layer and Moisture-Proof Layer

A heat-resisting releasable film (thickness: approx. 51 μm, CT50, Panac Co., Ltd.) and a polyethylene terephthalate film (to be the protective layer, thickness: 6 μm, Lumilar, Toray Industries, Inc.) were laminated. On the protective layer of the laminate, a $SiO_2$ layer (thickness: 100 nm), a hybrid layer of $SiO_2$/polyvinyl alcohol (PVA) ($SiO_2$:PVA=1:1 [by weight], thickness: 600 nm) and another $SiO_2$ layer (thickness: 100 nm) were successively formed according to the sputtering process, the sol-gel process and the sputtering process, respectively. Thus, a three-layered moisture-proof layer was prepared (4) Fixation with Adhesive Layer A polyester resin (VYLON 300, Toyobo Co., Ltd.) was mixed with methyl ethyl ketone to prepare a coating solution for forming the adhesive layer. The coating solution was spread to coat the moisture-proof layer-surface of the above laminate by means of a coating machine, and dried to prepare an adhesive layer (thickness: 0.3 μm). The thus-treated laminate was placed on the phosphor layer so that the adhesive layer was in contact with the phosphor layer, and then heated and pressed so that the laminate was completely glued on the phosphor layer via the adhesive layer. Finally, only the releasable film was peeled off.

In this way, a radiation image storage panel of the invention comprising the support, the phosphor layer, the adhesive layer, the moisture-proof layer and the protective layer, laminated in this order, was produced (see, FIG. 1). The moisture-proof layer was found to have the moisture permeability of 0.06 $g/m^2$·day and the surface reflectance of 3% at 650 nm (wavelength of the stimulating light). This reflectance indicates that the moisture-proof layer serves as the stimulating light-antireflection layer.

EXAMPLES 2 TO 6

The procedure of Example 1 was repeated except for forming the adhesive layer having each thickness shown in Table 1, to produce radiation image storage panels of the invention.

COMPARISON EXAMPLE 1

The procedure of Example 1 was repeated except for forming the adhesive layer having 0.1 μm thickness, to produce a radiation image storage panel for comparison.

COMPARISON EXAMPLE 2

The procedure of Example 1 was repeated except for forming the adhesive layer having 2.5 μm thickness, to produce a radiation image storage panel for comparison.

[Evaluation of Radiation Image Storage Panel]

For evaluating the produced radiation image storage panel, the intrusion depth of the adhesive layer, the adhesion strength of the protective layer and the sharpness of radiation image were measured in the following manners.

(1) Intrusion Depth

The sample panel was cut into ten pieces, and the section of each piece was observed with a scanning electron microscope to measure the intruding depth within the width of 1 mm. The measured depths of the pieces were averaged to determine the intrusion depth of the storage panel.

(2) Adhesion Strength

The surface of the sample panel was scratched to make flaws at intervals of 1 cm in the protective layer and the moisture-proof layer. The flawed area was peeled by means of the tensile tester (angle: 180°, speed: 1 cm/minute), to measure the adhesion strength.

(3) Sharpness

Each radiation image storage panel was exposed through a MTF chart to X-rays (tungsten tube, voltage: 80 kVp, 10 mR), and then a semi-conductor laser beam (wavelength: 660 nm) was linearly applied so that the stimulation energy on the panel surface might be 5 $J/m^2$. The stimulated emission given off from the panel surface was received with a line scanner (comprising many CCDs aligned linearly), and converted into electric signals. The obtained electric signals were processed by an image reproducing apparatus to reproduce an image on a display. From the reproduced image, the MTF (in relative value) at the spatial frequency of 1 c/mm was measured to determine the sharpness.

The results are shown in Table 1.

TABLE 1

| | Adhesive layer | | | Adhesion | |
| Ex. | thickness (μm) | intruding depth (μm) | Sharpness (1 c/mm) | strength (N/cm) | Grade |
| --- | --- | --- | --- | --- | --- |
| Ex. 1 | 0.3 | 0.3 | 100 | 0.2 | good |
| Ex. 2 | 0.5 | 0.4 | 99 | 0.5 | excellent |
| Ex. 3 | 1.0 | 0.8 | 98 | 0.8 | excellent |
| Ex. 4 | 1.5 | 1.3 | 97 | 1.2 | excellent |
| Ex. 5 | 1.9 | 1.6 | 95 | 1.5 | good |
| Ex. 6 | 3.0 | 1.6 | 92 | 2.0 | good |
| Com. 1 | 0.1 | 0.1 | 100 | <0.1 | bad |
| Com. 2 | 2.5 | 2.2 | 86 | 2.1 | bad |

The results shown in Table 1 clearly indicate that each storage panels of the invention (Examples 1 to 6), in which the adhesive layer had a thickness of 0.3 μm or more and intruded into the phosphor layer in a depth of 2.0 μm or less, gave a radiation image of high sharpness and comprised the protective layer glued with sufficient adhesion strength. In contrast, the storage panel of Comparison Example 1, in which the adhesive layer had the thickness of 0.1 μm, comprised the protective layer glued with insufficient adhesion strength. Further, the storage panel of Comparison Example 2, in which the adhesive layer intruded into the phosphor layer in the depth of 2.2 μm, gave a radiation image of poor sharpness.

What is claimed is:

1. A phosphor panel, comprising a phosphor layer consisting essentially of phosphor in the form of columnar crystals and a protective layer provided thereon via an adhesive layer in contact with the protective layer and phosphor layer, wherein the adhesive layer has a thickness of 0.3 to 3.0 um and intrudes into the phosphor layer to a depth of 0.3 to 2.0 um.

2. The phosphor panel of claim 1, wherein the protective layer has a thickness in the range of 1 to 10 μm.

3. The phosphor panel of claim 1, wherein the protective layer is a resin film.

4. The phosphor panel of claim 1, wherein a moisture-proof layer made of inorganic substance and having a moisture permeability of 1 $g/m^2$ day or less is provided on at least one surface of the protective layer.

5. The phosphor panel of claim 1, wherein a stimulating light-antireflection layer is provided on at least one surface of the protective layer or of the moisture-proof layer.

6. The phosphor panel of claim 5, wherein the moisture-proof layer has a function as the stimulating light-antireflection layer.

7. The phosphor panel of claim 4, which comprises a support, the phosphor layer, the adhesive layer, the moisture-proof layer and the protective layer, placed in order.

* * * * *